United States Patent
Fukuhara et al.

(10) Patent No.: US 6,331,739 B1
(45) Date of Patent: Dec. 18, 2001

(54) FUSE IN TOP LEVEL METAL AND IN A STEP, PROCESS OF MAKING AND PROCESS OF TRIMMING

(75) Inventors: Hideyuki Fukuhara, Ami-machi; Shigeo Ashigaki, Tsuchiura, both of (JP)

(73) Assignee: Texas Instruments Incorporated, Dallas, TX (US)

( * ) Notice: Subject to any disclaimer, the term of this patent is extended or adjusted under 35 U.S.C. 154(b) by 1062 days.

(21) Appl. No.: 08/804,850

(22) Filed: Feb. 24, 1997

Related U.S. Application Data

(63) Continuation of application No. 08/413,651, filed on Mar. 30, 1995, now abandoned.

(51) Int. Cl.⁷ ............................. H01L 29/78; H01L 33/00
(52) U.S. Cl. ............................................. 257/789; 257/784
(58) Field of Search ..................................... 257/789, 784

(56) References Cited

U.S. PATENT DOCUMENTS

| | | | |
|---|---|---|---|
| 4,714,949 | * 12/1987 | Simmons et al. ..................... | 257/784 |
| 4,984,061 | * 1/1991 | Matsumoto ........................... | 257/782 |
| 5,404,045 | * 4/1995 | Mizushima ........................... | 257/698 |
| 5,430,595 | * 7/1995 | Wagner et al. ....................... | 257/380 |

* cited by examiner

*Primary Examiner*—Stephen D. Meier
(74) *Attorney, Agent, or Firm*—Lawrence J. Bassuk; W. James Brady; Frederick J. Telecky, Jr.

(57) ABSTRACT

A fuse link 16 is formed of a portion of a top level of patterned metal conductor in a multilevel conductor integrated circuit 10. A deposited layer of oxide material 26 covers the fuse link. Radiant energy from such as a laser 36 is directed through the oxide material 26 to heat and open the fuse link 16. Layers of deposited protective oxide 28 and PIX 30 then cover the fuse link and layer of oxide material. One photoprocessing step is avoided by locating the fuse link 16 and bond pad 22, both made from the top layer of conductive material, at different levels. The blanket etch then exposes the bond pad 22 while leaving the fuse link 16 covered. The fuse link can be formed down in a step 38 or the bond pad 22 can be formed above such as a group of memory cells 80. The bond pad 22 and fuse link 16 also can be formed at the same level with other process procedures.

15 Claims, 3 Drawing Sheets

FUSE IN TOP LEVEL METAL AND IN A STEP, PROCESS OF MAKING AND PROCESS OF TRIMMING

This application is a continuation of application Ser. No. 08/413,651, filed Mar. 30, 1995 now abandoned.

FIELD OF THE INVENTION

This invention relates generally to semiconductor integrated circuits. This invention relates particularly to integrated circuits including fuse links used to program selected features into the integrated circuit after manufacturing of the operational circuits is complete but before the integrated circuit receives its final protective coatings.

DESCRIPTION OF THE RELATED ART

The fuse links selectively program features such as redundancy in dynamic random access memory parts(DRAMs), voltage options, packaging pin out options, or any other option desired by the manufacturer to be implemented after substantial completion of the operational circuits, but before the final processing steps. This helps the manufacturer increase yield or facilitates the use of one basic design for several different end products.

The programming has often occurred by using the radiant energy of a laser beam. The laser beam is directed through a thinned section of transparent oxide material layer to heat and open a thin fuse link portion of a conductive layer carried by the semiconductor substrate. Typically the semiconductor substrate is processed to contain desired impurities and to carry desired layers of insulating material and conducting material to form the operational circuits. The operational circuits then are tested electrically and any desired options, such as using redundant circuits for non-operational circuits, are programmed into the part using a laser beam to open a certain fuse link or links.

Fuse links often have been formed as part of a conductive layer within the stack of layers formed above the semiconductor substrate. In particular, there is a thick oxide layer formed between the substrate and the fuse links. The bottom level of conductive material is patterned to form desired conductor leads and thin fuse links. The layers of conducting material formed over the bottom level of conductive material carefully avoid overlying the fuse link portions so the laser beam can access the fuse links from above. Currently as many as three layers of metal conductive material are used above the bottom layer of conductive material.

In one case, as a last step in manufacturing, the finally applied coatings of protective oxide nitride and PIX over the entire substrate are patterned and removed to provide access to the bond pads and all of the fuse links. The laser beam is directed down to a selected fuse link or links to heat and open the links. No further coatings are applied over the area opened for access to all of the fuse links. This case uses only one expensive photolithography process step to access all of the fuse links at the same time as opening the bond pads, but leaves the fuse link and the conductive materials extending from the opened fuse link exposed to the elements with no anti-moisture sealings. The exposed conductive material, such as a metal, can corrode and result in reliability problems. One solution for this is to provide a guard structure like the edge of a scribe line, but this requires larger fuse areas that increase chip size and manufacturing cost.

In another case, the oxide layers over the fuse link are patterned and etched to provide access to all of the fuse links before the protective overcoats are applied. The laser beam is then used to open the selected fuse links. The protective coatings of oxide nitride and PIX are then applied to seal the opened fuse links and photolithographically patterned to expose the bond pads. This case seals the opened fuse links from the elements, but requires the extra processing step of patterning and etching to access the fuse links in addition to patterning and etching the protective overcoats to access the bond pads. This increases manufacturing costs.

SUMMARY OF THE INVENTION

The claimed invention eliminates one photolithography step of patterning and etching in accessing the fuse links and opening the bond pads. The fuse link and bond pad are formed in the top layer of metal conducting material. The fuse link occurs at the bottom of a step in an insulating material prepared during processing and the bond pad occurs on the insulating material at a slightly higher level above the fuse link. A cap oxide then is deposited over both the fuse link and the bond pad. The cap oxide is planarized and blanket etched to expose the top surface of the bond pad while keeping the fuse link covered with a desired thickness of oxide material. This obtains an exposed bond pad and covered fuse link without an expensive processing step.

The partially completed part then can be electrically tested and any fuse programming performed through the oxide before the protective oxide nitride and PIX are applied, patterned and etched finally to expose the bond pads.

The downward step in the insulating layer that carries the fuse link can be formed by raising the bond pad section using an extra underlying layer. For example, a group of memory storage cells can be formed under the area to be used for the bond pad. Alternatively, a layer underlying the fuse link can be removed.

Alternatively, the fuse link and bond pad can be formed at the same level. In one of these cases, the cap oxide deposited over the fuse link and bond pad is removed from the bond pad by the mechanical and electrical stress of a probe needle contacting the bond pad for conducting the electrical testing. In another one of these cases, the bond pad is formed with fine slits, the cap oxide is deposited with an ECR oxide deposition technique, and the oxide etch leaves the fuse link covered while exposing the bond pad conductive material. In both of these cases, the step formation is not needed and exposing the bond pad while keeping the fuse link covered with deposited cap oxide can be achieved with only a deposition process.

BRIEF DESCRIPTION OF THE DRAWING FIGURES

DETAILED DESCRIPTION

Figure 1A:
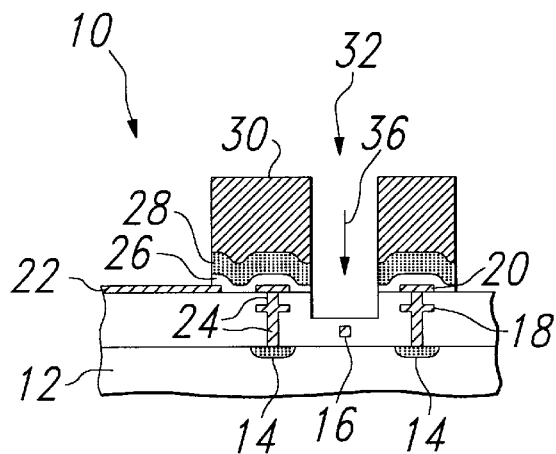
FIGS. 1a and 1b are stylized vertical sectional views of an integrated circuit having a known fuse configuration respectively during and after applying the laser beam to the fuse link.

In FIG. 1, as described in the Description of the Related Art, integrated circuit 10 includes substrate 12 containing impurities 14 formed as desired. Above the top surface of substrate 12, a first conductive layer of polysilicon material is patterned and etched to form a fuse link 16. Suitable insulating materials are formed between the first conductive layer of polysilicon and the top surface of the substrate 12 to insulate fuse link 16 from substrate 12. Other processing steps also occur to form other circuit devices as may be desired.

Above the level of fuse 16, a first level of metal material 18 is patterned and etched to form desired conductive leads. Again a layer of insulating material can be formed between the level of fuse 16 and first metal material 18 to insulate the polysilicon material of the fuse 16 from the conductive metal material 18. Above the first level of metal material 18, a second level of metal material 20 is patterned and etched to form desired conductive leads in the integrated circuit 10. One of the features patterned and etched in the second level of metal material 20 is a bond pad 22. Between the impurities 14, the first level of metal material 18 and the second level of metal material 20, vias 24 can be formed as desired to interconnect vertically the conductive leads in the levels of conductive material whether they are polysilicon, or metal, such as aluminum.

Above the second level of metal material 20, cap oxide material 26 is formed and subsequently covered by a protective oxide nitride layer 28 and a PIX layer 30. The cap oxide layer 26, the protective oxide nitride layer 28 and the PIX material 30 serve to overcoat and protect the top of the integrated circuit from the elements such as moisture.

After these layers are formed on the integrated circuit 10, the cap oxide layer 26, protective oxide nitride layer 28 and the PIX layer 30 are photoprocessed by patterning and etching to remove them from the top surface of bonding pad 22 and to form an opening 32 to above fuse link 16. A laser beam is directed on selected ones of the fuse link 16 to heat and open any electrical connection between the two ends of the fuse link. This programs the integrated circuit for any desired operation previously described.

Figure 1B:
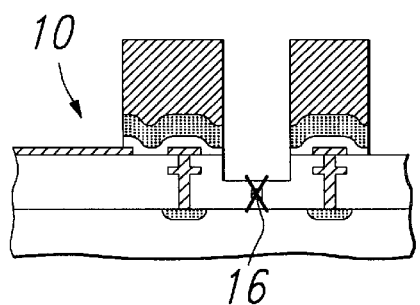

In FIG. 1b, the fuse link 16 is opened and no further layers are deposited or formed on the top of the integrated circuit 10. This leaves the opened fuse link 16 exposed to intrusion by moisture and can result in the reliability problems previously explained.

Figure 2A:
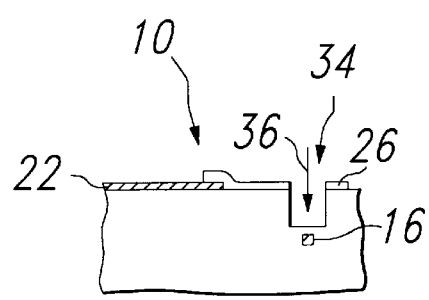
FIGS. 2a and 2b are stylized vertical sectional views of an integrated circuit having a known fuse configuration respectively during and after applying the laser beam to the fuse link.
Figure 2B:
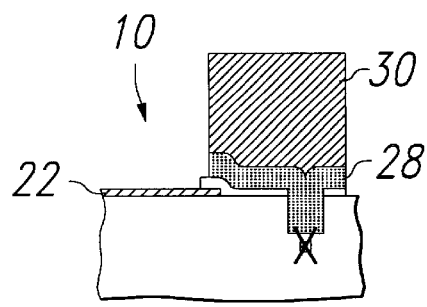

In FIG. 2a, as described in the Description of the Related Arts, although not specifically depicted, all of the layers previously described in FIG. 1a have been formed up to the cap oxide layer 26. A photoprocessing step of patterning and etching have occurred to form an opening 34 for access to fuse 16. Laser beam 36 then is directed under selected ones of the fuse link 16 to open the same. In FIG. 2b, after programming the fuse link 16, the protective oxide nitride layer 28 and the PIX layer 30 are deposited on top of the integrated circuit 10 and are patterned and etched to uncover bonding pad 22. The formation of the fuse link 16 and programming capability depicted in FIG. 2 requires two pattern and etch steps first to provide access to fuse link 16 and after the protective oxide nitride layer 28 and PIX coat 30 are applied to provide access to bonding pad 22.

Figure 3A:
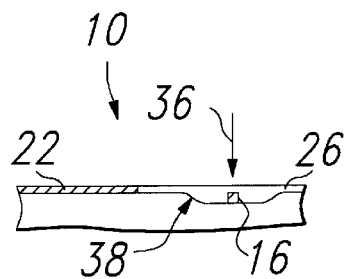
FIGS. 3a and 3b are stylized vertical sectional views of an integrated circuit having a fuse configuration of the claimed invention respectively during and after applying the laser beam to the fuse link.

In FIG. 3a, according to the present invention, although not specifically depicted, all of the layers previously described in FIG. 1a have been formed including the cap oxide layer 26. Additionally, the top of the entire integrated circuit 10, which is covered with cap oxide layer 26, is blanket etched to expose the bond pad 22. The fuse link 16 is formed at the bottom of a step formation 38 formed in the underlying layers of material grown or deposited over substrate 12. This places the top surface of the fuse link 16 at a level below the top surface of the bonding pad 22. The result of the blanket etch leaves sufficient thickness of the cap oxide nitride layer 26 to cover the top surface of fuse link 16. After electrical testing, laser beam 36 can be applied to selected ones of fuse link 16 to provide desired programming.

Figure 3B:
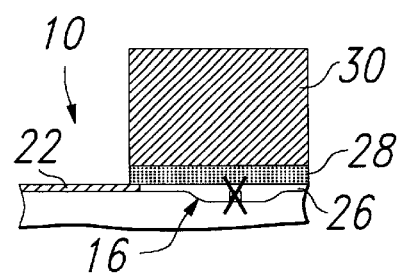

In FIG. 3b, the protective oxide nitride layer 28 and the PIX layer 30 have been applied and photoprocessed to open access to the top surface of bond pad 22.

By thus forming the fuse 16 in the step 38, an inexpensive blanket etch-back of the cap oxide layer 26 exposes the bond pad 22 and leaves the fuse 16 properly covered with cap oxide material 26. The fuse link 16 is formed from and requires only a small area of the top level of conductive material. Exposing the bond pad 22 with the blanket etch facilitates electrical testing of the integrated circuit 10. The fuse link then can be trimmed through the cap oxide layer 26. After trimming, the fuse link 16 is sealed against moisture by the overcoat materials and the bond pad 22 is accessed, for applying a bond wire, through the use of only one photoprocess pattern and etch procedure.

The cap oxide layer is proposed to prevent any hillock growth and oxidation of the top level of metal during the sintering that usually occurs after the cap oxide deposition. This nicely leaves the cap oxide as the required shield material over the fuse link for trimming.

Figure 4A:
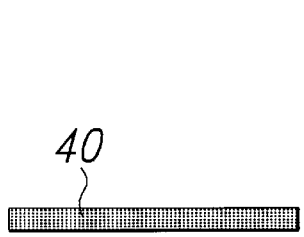
FIGS. 4a, 4b and 4c are stylized side sectional views depicting the process steps for forming a step.
Figure 4B:
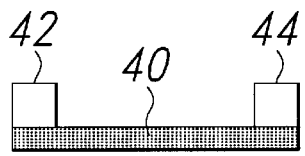
Figure 4C:
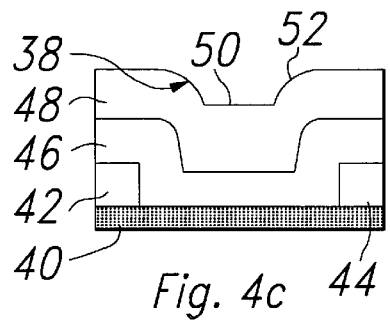

FIG. 4 depicts one procedure to obtain a desired step formation. In FIG. 4a, the procedure starts with making a patterned polysilicon formation 40. In FIG. 4b, an oxide layer has been deposited, patterned and etched to obtain two oxide formations 42 and 44. The polysilicon material 40 has acted as a stopper for the etch step. In FIG. 4c, two additional oxide layers 46 and 48 are deposited or formed over the oxide formations 42 and 44 and polysilicon material 40 to obtain the desired step formation 38. The step formation substantially results in a flat bottom portion 50 with sloping sidewalls 52.

Figure 5A:
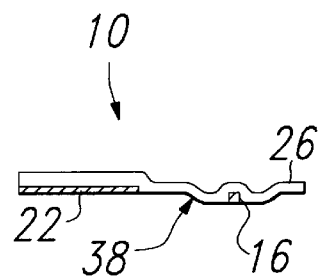
FIGS. 5a, 5b and 5c are stylized side sectional views depicting the process steps of a first planarizing procedure.
Figure 5B:
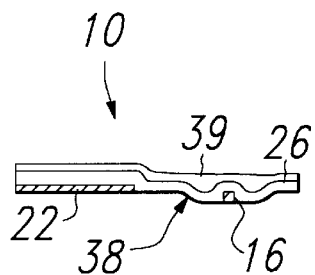
Figure 5C:
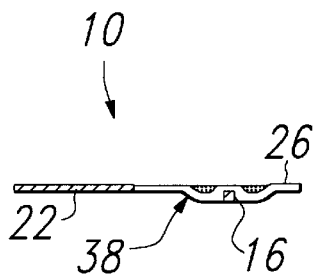

In FIG. 5a, fuse link 16 and bonding pad 22 are formed of the top level metal material. Fuse link 16 has been formed in the bottom of the step formation 38 and the cap oxide layer 26 has been formed uniformly to cover the fuse link 16 and the bonding pad 22. In FIG. 5b, the top surface of the integrated circuit 10 is planarized with a spin-on glass (SOG) that is sintered to turn it into a glass oxide film. In FIG. 5c, a blanket etch across the entire surface of the integrated circuit 10 opens the bond pad 22 but maintains the fuse link 16 under at least a portion of the cap oxide layer 26. This is another procedure that can be used to eliminate a photoprocessing step of patterning and etching to expose fuse link 16 or bond pad 22.

Figure 6A:
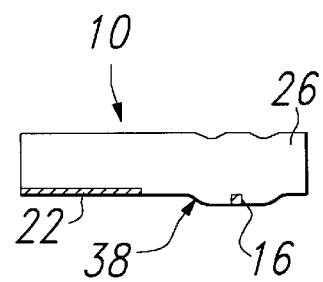
FIGS. 6a, 6b and 6c are stylized side sectional views depicting the process steps of a second planarizing procedure.
Figure 6B:
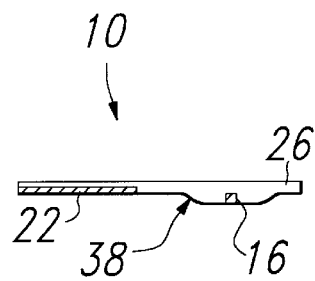
Figure 6C:
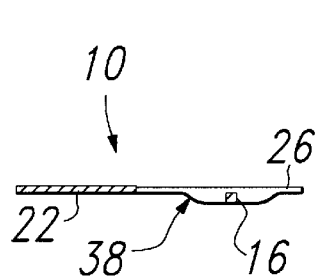

In FIG. 6, although not specifically depicted, all of the layers previously described in FIG. 1a have been formed up to the cap oxide layer 26. In FIG. 6a, cap oxide layer 26 is deposited as a thick oxide. In FIG. 6b, cap oxide layer 26 has been planarized with a chemical mechanical polishing step. In FIG. 6c, a blanket etch across the entire surface of the integrated circuit 10 occurs to expose the bond pad 22 while maintaining some cap oxide 26 material above fuse link 16 in step formation 38.

Figure 7A:
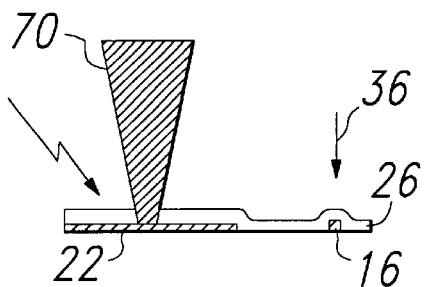
FIGS. 7a and 7b are stylized side sectional views depicting the bond pad and fuse link at the same level.

In FIG. 7, fuse link 16 and bonding pad 22 are formed of the top level metal material. Although not specifically depicted, all of the layers previously described in FIG. 1a have been formed including the cap oxide layer 26. In FIG. 7a, fuse link 16 occurs at the same horizontal level as bond pad 22. Cap oxide layer 26 is deposited equally over both fuse link 16 and bond pad 22. A probe needle 70, used for electrical testing of the circuits carried on integrated circuit 10, provides sufficient mechanical and electrical stress physically to break the portion of the cap oxide layer 26 from above bond pad 22. This provides access to the bond pad 22 without any patterning or etching of cap oxide layer 26. Laser beam 36 then is used to open selected ones of fuse links 16.

Figure 7B:
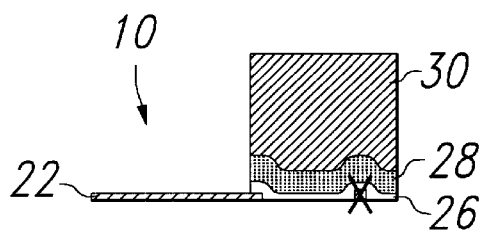

In FIG. 7b, the protective oxide nitride layer 28 and PIX layer 30 then are applied, patterned and etched to obtain access to bond pad 22 while sealing the trimmed fuse link 16. All of the processing in the structures depicted in FIG. 7 occur without any step formation 38.

Figure 8A:
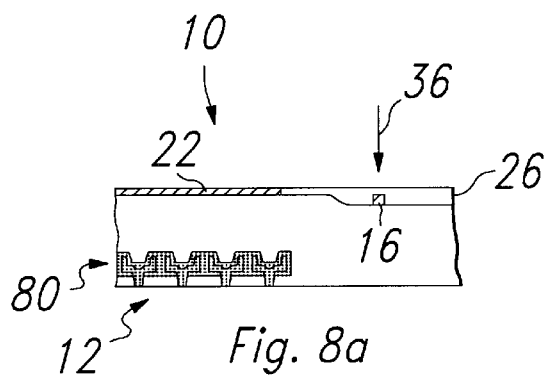
FIGS. 8a and 8b are stylized side sectional views depicting forming a step over a dummy memory cell structure.
Figure 8B:
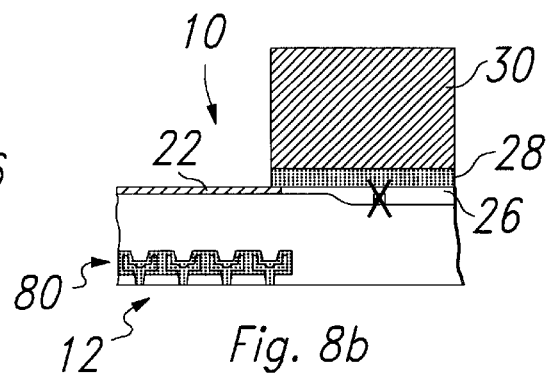

In FIG. 8, the effect of a step formation 38 is obtained through other means. In FIG. 8a, a group of active or dummy memory cells 80 is formed on substrate 12. The bond pad 22 later is formed over the memory cell structure 80. The fuse link 16 is formed to the side of the memory cell structure 80. Again, both bonding pad 22 and fuse link 16 are formed of the top level metal material. With the deposition or formation of the additional layers of insulative and conductive materials between substrate 12 and the bonding pad 22 and fuse link 16, the bonding pad 22 is placed at a higher level then the fuse link 16 because of the additional height of the memory cell structure 80. The cap oxide layer 26 then is deposited over the bonding pad 22 and the fuse link 16 and planarized to expose bonding pad 22 while leaving fuse link 16 covered with some thickness of cap oxide layer 26. Laser beam 36 then can be directed onto selected ones of fuse link 16 for opening the fuse links. In FIG. 8b, the protective oxide nitride layer 28 and PIX layer 30 are applied, patterned and etched to expose the bonding pad 22.

Figure 9A:
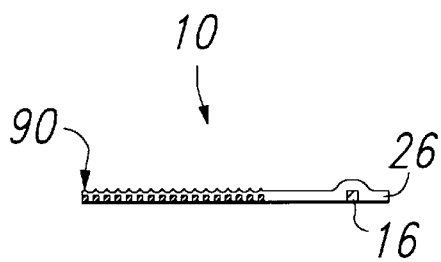
FIGS. 9a, 9b and 9c are stylized side sectional views depict the process steps of forming the bond pad and fuse link at the same level.
Figure 9B:
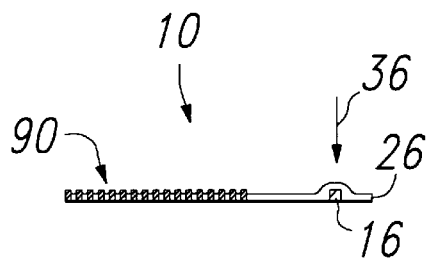
Figure 9C:
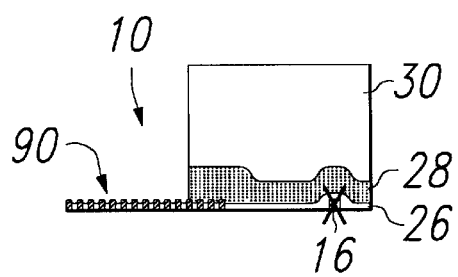

In FIG. 9, fuse link 16 and bonding pad 22 are again formed of top level metal material and a thinner cap oxide thickness over the bond pad than over the fuse link is obtained by a different means. In FIG. 9a, bond pad 90 comprises metal material formed with fine slits. The cap oxide layer 26 is deposited over the bond pad 90 and fuse link 16 using a bias plasma electron cyclotron resonance procedure. This leaves the cap oxide layer 26 thinner over the bond pad 90 than over the fuse link 16. In FIG. 9b, a blanket etch of the entire top surface of the integrated circuit 10 exposes the top surface of the bond pad 90 while maintaining the fuse link 16 covered with a desire thickness of cap oxide layer 26. In FIG. 9c, the protective oxide nitride layer 28 and PIX layer 30 are formed across the top of the integrated circuit 10, patterned and etched to expose the bond pad 90 for attaching a bond wire.

The disclosed and claimed invention thus reduces manufacturing costs and cycle times by eliminating a complete photoprocessing step of forming a photo resist layer, patterning the photo resist layer, exposing the photo resist layer, washing away the unexposed portions of the resist, performing an etch of the underlying material and then stripping away the resist material.

Instead, the claimed invention forms the fuse links under the cap oxide layer by using a blanket etch step to expose the top surface of the bond pad while maintaining the fuse link under a desired thickness of the cap oxide layer. Afterwards the layers of the protective oxide nitride 28 and PIX 30 are formed over the fuse links 16 to seal any opened fuse links. The blanket etch of the entire top surface of the integrated circuit 10 occurs inexpensively and quickly during manufacturing.

A person of ordinary skill will recognize that the drawing figures are stylized to emphasize the disclosed and claimed invention and avoid confusion with the multiple layers formed between the substrate 12 and the top level metal material used to form the fuse link 16 and bond pad 22. A person of ordinary skill also will recognize that while only one fuse link and one bond pad are depicted in these drawing figures, many other fuse links and bond pads can be arranged at desired locations across the integrated circuit 10 as may be desired. The bond pads can be located distal from any fuse link. A person of ordinary skill also will recognize that different means can be used to obtain a step formation or the benefits of a step formation without the use of a step formation as disclosed in this patent. Forming the fuse link in the top layer or level of conductive material also avoids deep etching of the layers covering the integrated circuit. Other variations can be used while remaining within the scope of the claims.

We claim:
1. An integrated circuit, comprising:
   A. a substrate of semiconductor material;
   B. a patterned layer of polysilicon formed over and insulated from the substrate;
   C. a first patterned layer of metal formed over and insulated from the patterned layer of polysilicon;
   D. a top layer of patterned metal formed over the first patterned layer of metal, at least one fuse portion of the top layer of patterned metal forming a fuse link; and
   E. an oxide layer formed over at least the fuse portion of the top layer of patterned metal.
2. The integrated circuit of claim 1 in which the top layer of patterned metal includes at least a bond portion forming a bond pad that is substantially free of any oxide layer.
3. The integrated circuit of claim 1 including a protective oxide nitride over the oxide layer, and a pix layer over the protective oxide nitride layer.
4. The integrated circuit of claim 1 in which the top layer of patterned metal includes at least a bond portion forming a bond pad that is substantially free of any oxide layer, the bond portion and the fuse portion each having a top surface and the top surface of the bond portion being at a level above the top surface of the fuse portion.
5. The integrated circuit of claim 4 including a dummy memory cell structure arranged below the bond portion to raise the bond portion above the fuse portion.
6. The integrated circuit of claim 1 in which the top layer of patterned metal includes at least a bond portion forming a bond pad that is substantially free of any oxide layer and the bond portion being formed of plural, parallel strips of metal occurring at the same level as the fuse portion.
7. The integrated circuit of claim 1 in which the top layer of patterned metal includes at least a bond portion forming a bond pad that is substantially free of any oxide layer and the bond portion occurring at the same level as the fuse portion.

8. An integrated circuit, comprising:

A. a substrate of semiconductor material; and

B. a layer of patterned metal formed over the substrate, at least one bond pad portion of the layer of patterned metal forming a bond pad and at least one fuse portion of the layer of patterned metal forming a fuse link.

9. The integrated circuit of claim 8 in which the bond pad is substantially free of any oxide layer.

10. The integrated circuit of claim 8 including an oxide layer over the fuse link, a protective oxide nitride over the oxide layer, and a pix layer over the protective oxide nitride layer.

11. The integrated circuit of claim 8 in which the bond portion and the fuse portion each have a top surface and the top surface of the bond portion is at a level above the top surface of the fuse portion.

12. The integrated circuit of claim 8 including a memory cell structure arranged below the bond portion to raise the bond portion above the fuse portion.

13. The integrated circuit of claim 8 in which the bond portion is formed of plural, parallel strips of metal occurring at the same level as the fuse portion.

14. The integrated circuit of claim 8 in which the bond pad substantially occurs at the same level as the fuse portion.

15. The integrated circuit of claim 8 in which the bond pad substantially occurs at a level above the fuse portion.

* * * * *